United States Patent
Jeong et al.

(10) Patent No.: US 10,109,658 B2
(45) Date of Patent: Oct. 23, 2018

(54) LED CHIP MOUNTING APPARATUS AND METHOD OF MANUFACTURING DISPLAY APPARATUS BY USING THE LED CHIP MOUNTING APPARATUS

(71) Applicant: SAMSUNG DISPLAY CO., LTD., Yongin-si, Gyeonggi-do (KR)

(72) Inventors: Changyong Jeong, Yongin-si (KR); Mugyeom Kim, Yongin-si (KR); Jongsung Bae, Yongin-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/464,722

(22) Filed: Mar. 21, 2017

(65) Prior Publication Data

US 2017/0278835 A1    Sep. 28, 2017

(30) Foreign Application Priority Data

Mar. 22, 2016  (KR) .......................... 10-2016-0033990

(51) Int. Cl.
| | |
|---|---|
| *H01L 33/62* | (2010.01) |
| *H01L 27/12* | (2006.01) |
| *H01L 25/16* | (2006.01) |
| *H01L 23/00* | (2006.01) |

(52) U.S. Cl.
CPC .......... *H01L 27/1248* (2013.01); *H01L 24/75* (2013.01); *H01L 24/95* (2013.01); *H01L 25/167* (2013.01); *H01L 33/62* (2013.01); *H01L 2224/7598* (2013.01); *H01L 2224/75655* (2013.01); *H01L 2224/75754* (2013.01); *H01L 2224/951* (2013.01); *H01L 2224/95136* (2013.01); *H01L 2933/0033* (2013.01); *H01L 2933/0066* (2013.01)

(58) Field of Classification Search
None
See application file for complete search history.

(56) References Cited

U.S. PATENT DOCUMENTS

| | | | |
|---|---|---|---|
| 2016/0148911 A1* | 5/2016 | Do | ................. H01L 25/0753 257/88 |
| 2017/0279019 A1* | 9/2017 | Ueda | ................. H01L 33/62 |

FOREIGN PATENT DOCUMENTS

| | | |
|---|---|---|
| JP | 2011-198697 A | 10/2011 |
| KR | 10-2014-0065933 A | 5/2014 |
| KR | 10-2015-0006798 A | 1/2015 |

\* cited by examiner

*Primary Examiner* — Bilkis Jahan
(74) *Attorney, Agent, or Firm* — Lee & Morse, P.C.

(57) ABSTRACT

A light emitting diode chip mounting apparatus includes a guide plate including a first surface and a second surface opposite to the first surface, the second surface including at least one first tunnel that extends in a first direction, wherein the first tunnel defines a concave portion and the second surface includes a convex portion adjacent to the concave portion. The first tunnel is sized to accommodate a light emitting diode chip flowing therethrough.

17 Claims, 7 Drawing Sheets

LED CHIP MOUNTING APPARATUS AND METHOD OF MANUFACTURING DISPLAY APPARATUS BY USING THE LED CHIP MOUNTING APPARATUS

CROSS-REFERENCE TO RELATED APPLICATION

Korean Patent Application No. 10-2016-0033990, filed on Mar. 22, 2016, in the Korean Intellectual Property Office, and entitled: "LED Chip Mounting Apparatus and Method of Manufacturing Display Apparatus by Using the LED Chip Mounting Apparatus," is incorporated by reference herein in its entirety.

BACKGROUND

1. Field

One or more embodiments relate to light emitting diode (LED) chip mounting apparatuses and method of manufacturing display apparatuses using the LED chip mounting apparatus.

2. Description of the Related Art

A light emitting diode (LED) is a semiconductor device in which when a forward voltage is applied to a PN junction diode, holes and electrons are injected thereinto and energy generated by recombination of the holes and the electrons is converted into light energy.

For example, inorganic LEDs using inorganic compounds to emit light are widely used in electronic display boards, illuminations, and backlights of liquid crystal display televisions (LCD TVs); and organic LEDs using organic compounds to emit light are recently used in large TVs and small electronic devices such as mobile phones.

SUMMARY

According to one or more embodiments, an LED chip mounting apparatus includes: a guide plate including a first surface and a second surface opposite to the first surface, the second surface including at least one first tunnel that extends in a first direction, wherein the first tunnel defines a concave portion in the second surface and the second surface includes a convex portion disposed adjacent to the concave portion. The first tunnel is sized to accommodate an LED chip flowing therethrough.

The second surface may further include at least one second tunnel that extends in a second direction perpendicular to the first direction.

The LED chip mounting apparatus may further include a mask on the second surface and contacting at least a portion of the convex portion.

According to one or more embodiments, a method of manufacturing a display apparatus includes: preparing a guide plate including a first surface and a second surface opposite to the first surface, the second surface including at least one first tunnel extending in a first direction; attaching an array substrate including at least one thin film transistor and at least one opening portion to the second surface of the guide plate; inserting at least one LED chip into the first tunnel in the first direction; moving the at least one LED chip in the first tunnel; and seating the at least one LED chip on the at least one opening portion in the first tunnel.

The method may further include immersing the guide plate, the array substrate, and the at least one LED chip into a solution after attaching the guide plate and the array substrate together, wherein the at least one LED chip may move in the first tunnel by the solution.

The solution may include a conductive particle, and the at least one LED chip may move in the first tunnel by the solution including the conductive particle.

The solution may include at least one flexible particle, and the at least one LED chip and the at least one flexible particle may be alternately inserted into the first tunnel.

The at least one LED chip may move in the first tunnel by air or inert gas.

The inert gas may include one of argon (Ar), nitrogen ($N_2$), and helium (He).

The air or the inert gas may include a conductive particle.

The air or the inert gas may include at least one flexible particle, and the at least one LED chip and the at least one flexible particle may be alternately inserted into the first tunnel.

The array substrate may further include a first electrode exposed by the at least one opening portion and two or more bank layers disposed to cover a portion of the first electrode, and the two or more bank layers may be formed to have different heights.

The height of the bank layer may increase gradually away from a side where the LED chip is inserted.

At least one second tunnel extending in a second direction perpendicular to the first direction may be disposed at the second surface of the guide plate.

The at least one LED chip may be inserted into the at least one first tunnel in the first direction or may be inserted into the at least one second tunnel in the second direction.

A plurality of first color pixel units, second color pixel units, and third color pixel units may be arranged on the array substrate, a mask may be disposed between the array substrate and the second surface of the guide plate, and the mask may be disposed at a position corresponding to at least a portion among the plurality of first color pixel units, second color pixel units, and third color pixel units.

The at least one LED chip may be seated on the opening portion formed at the first color pixel unit, the second color pixel unit, or the third color pixel unit where the mask is not disposed.

The at least one LED chip inserted into the first tunnel may be a first color LED chip, the mask may be disposed at a position corresponding to the second color pixel unit and the third color pixel unit, and the first color LED chip may be seated on the opening portion of the first color pixel unit.

The first color pixel unit, the second color pixel unit, and the third color pixel unit may be arranged sequentially in a row direction.

The first color pixel unit, the second color pixel unit, and the third color pixel unit may be arranged sequentially in a column direction.

BRIEF DESCRIPTION OF THE DRAWINGS

Features will become apparent to those of skill in the art by describing in detail exemplary embodiments with reference to the attached drawings in which.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that although the terms "first", "second", etc. may be used herein to describe various components, these components should not be limited by these terms. These terms are only used to distinguish one component from another.

As used herein, the singular forms "a", "an", and "the" are intended to include the plural forms as well, unless the context clearly indicates otherwise.

It will be further understood that the terms "comprise", "include", and "have" used herein specify the presence of stated features or components, but do not preclude the presence or addition of one or more other features or components.

It will be understood that when a layer, region, or component is referred to as being "formed on" another layer, region, or component, it may be directly or indirectly formed on the other layer, region, or component. That is, for example, intervening layers, regions, or components may be present.

Sizes of components in the drawings may be exaggerated for convenience of description. In other words, since sizes and thicknesses of components in the drawings are arbitrarily illustrated for convenience of description, the following embodiments are not limited thereto.

When a certain embodiment may be implemented differently, a specific process order may be performed differently from the described order. For example, two consecutively described processes may be performed substantially at the same time or performed in an order opposite to the described order.

Figure 1:
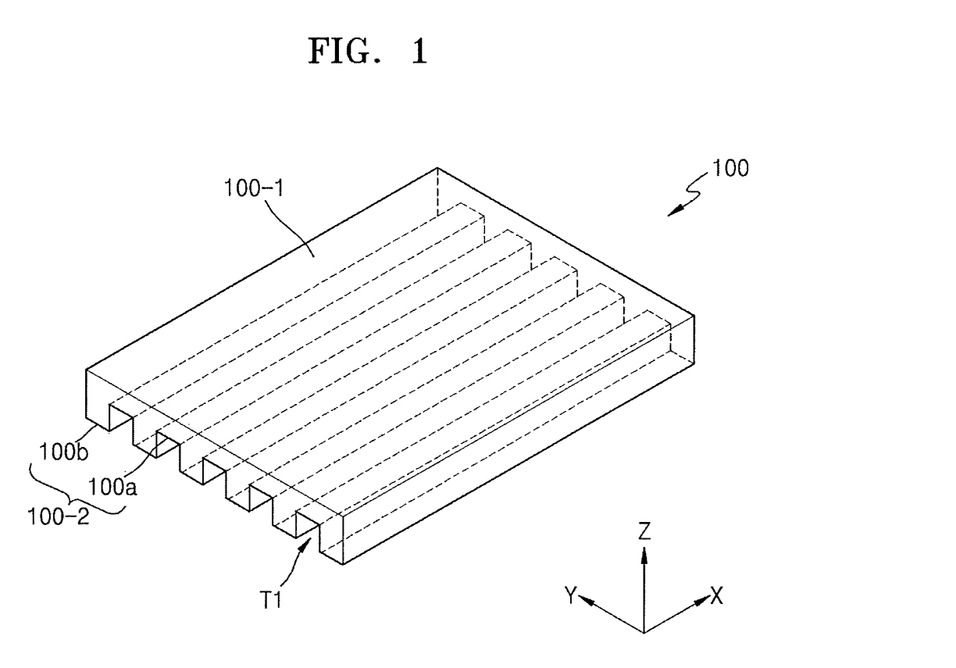
FIG. 1 illustrates a schematic perspective view of a light emitting diode (LED) chip mounting apparatus according to an embodiment.

FIG. 1 is a perspective view schematically illustrating a light emitting diode (LED) chip mounting apparatus according to an embodiment. An LED chip mounting apparatus according to the present embodiment may include a guide plate 100 including at least one tunnel T1.

The guide plate 100 may include a first surface 100-1 and a second surface 100-2 opposite to the first surface 100-1. The first tunnel T1 may be disposed at the second surface 100-2 of the guide plate 100. As an embodiment, the first tunnel T1 may extend in a first direction X. However, embodiments are not limited thereto, e.g., the first tunnel T1 may extend in a second direction Y perpendicular to the first direction X. Although FIG. 1 illustrates an embodiment in which five first tunnels T1 are on the second surface 100-2, the number of first tunnels T1 is not limited thereto, e.g., one or more first tunnels T1 may be disposed.

In the LED chip mounting apparatus according to the present embodiment, the first tunnel T1 may be formed to pass through two surfaces that are perpendicular to the first surface 100-1 and the second surface 100-2 and face each other, e.g., side surfaces of the guide plate 100. In this case, as illustrated in FIG. 1, the second surface 100-2 of the guide plate 100 where the first tunnel T1 is disposed may include a concave portion 100a and a convex portion 100b. In other words, the second surface 100-2 may have a concave-convex shape.

That is, since the first tunnel T1 is on the second surface 100-2 and passes through the side surfaces of the guide plate 100, the concave portion 100a of the second surface 100-2 may correspond to a portion where the first tunnel T1 is formed and the convex portion 100b may correspond to a portion adjacent to the concave portion 100a and where the first tunnel T1 is not formed. As an embodiment, when two or more first tunnels T1 are disposed at the second surface 100-2, the concave portion 100a may correspond to a portion where the first tunnel T1 is formed and the convex portion 100b may correspond to a portion between two first tunnels T1. If there is a single first tunnel T1, two convex portions 110b may define the first tunnel.

Figure 2A:
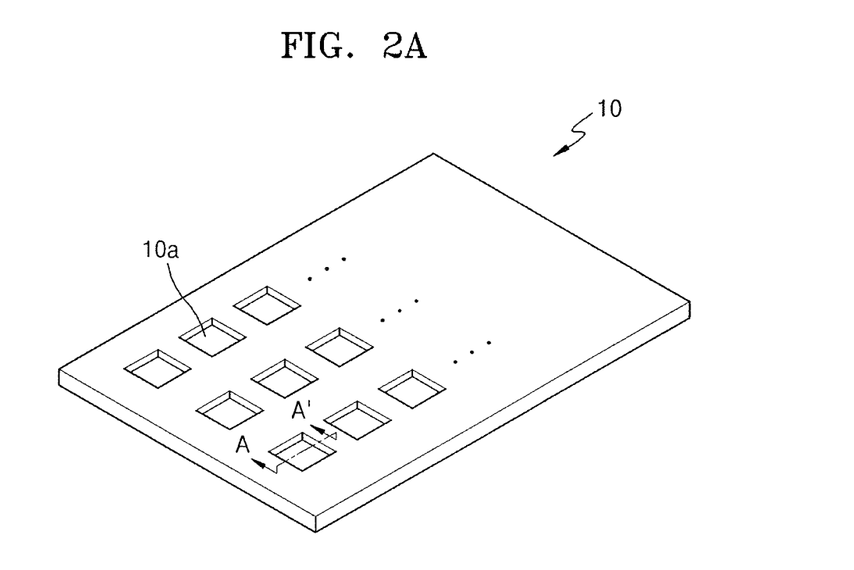
FIG. 2A illustrates a schematic perspective view of an array substrate according to an embodiment.
Figure 2B:
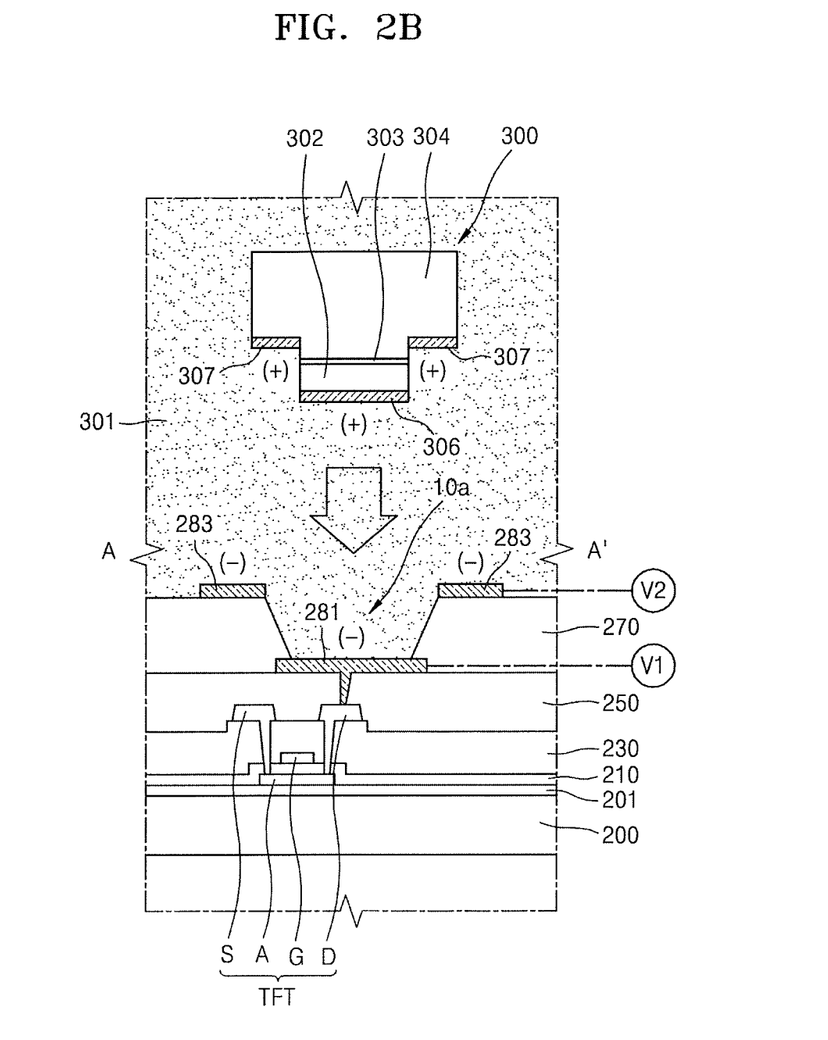
FIG. 2B illustrates a schematic cross-sectional view of a cross section of an LED chip and an A-A' cross section of the array substrate of FIG. 2A.
Figure 3A:
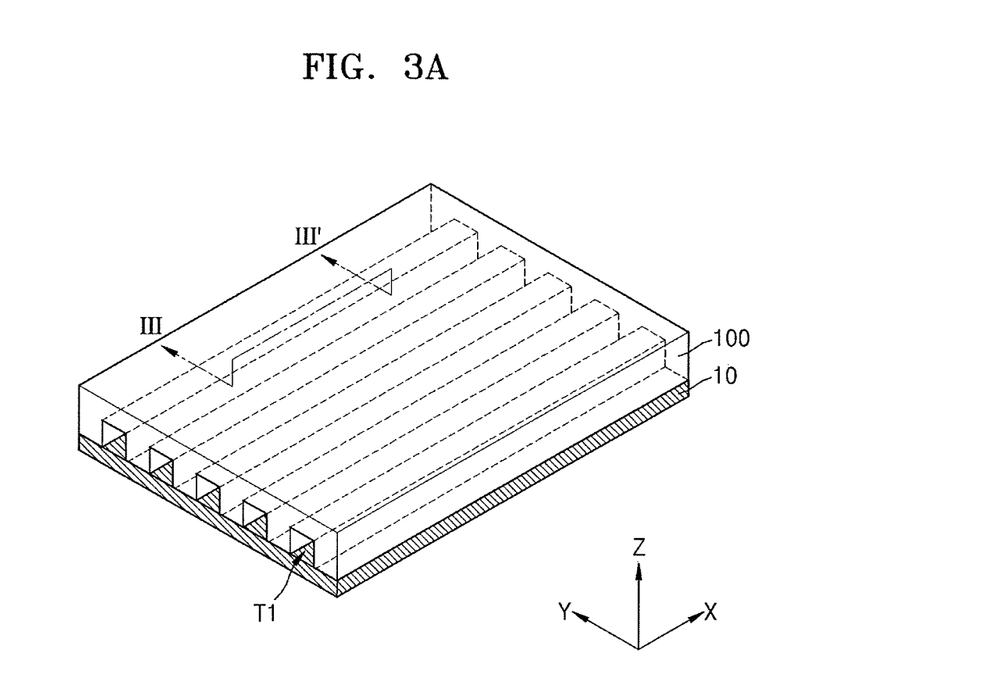
FIG. 3A illustrates a schematic perspective view of a joined combination of the LED chip mounting apparatus of FIG. 1 and the array substrate of FIG. 2A.
Figure 3B:
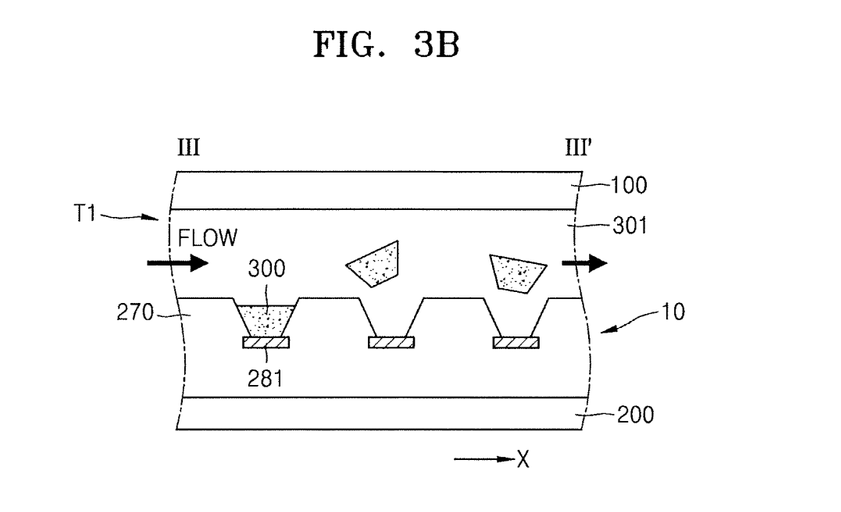
FIG. 3B illustrates a cross-sectional view of a method of manufacturing a display apparatus according to an embodiment, which schematically illustrates a moving LED chip and a III-III' cross section of FIG. 3A.

FIG. 2A is a perspective view schematically illustrating an array substrate according to an embodiment. FIG. 2B is a cross-sectional view schematically illustrating a cross section of an LED chip and an A-A' cross section of the array substrate of FIG. 2A. FIG. 3A is a perspective view schematically illustrating a joined combination of the LED chip mounting apparatus of FIG. 1 and the array substrate of FIG. 2A. FIG. 3B is a cross-sectional view of a method of manufacturing a display apparatus according to an embodiment, which schematically illustrates a moving LED chip and a cross section of FIG. 3A.

Hereinafter, a method of manufacturing a display apparatus according to an embodiment by using the LED chip mounting apparatus illustrated in FIG. 1 will be described in detail with reference to FIGS. 2A, 2B, 3A, and 3B. In FIGS. 2A to 3B, like reference numerals as in FIG. 1 will denote like elements and redundant descriptions thereof will be omitted herein for conciseness.

An array substrate 10 according to the present embodiment may include at least one thin film transistor TFT and at least one opening portion 10a. As illustrated in FIG. 2B, the array substrate 10 may include at least one thin film transistor TFT on a substrate 200. A planarization layer 250 may be formed on the thin film transistor TFT. A first electrode 281 may be on the planarization layer 250 and may be connected to the thin film transistor TFT through a via hole extending along a third direction Z through the planarization layer 250. Also, the array substrate 10 may include a bank layer 270 on the planarization layer 250 that may cover a portion of the first electrode 281.

The substrate 200 may include various materials. For example, the substrate 200 may be formed of glass materials or plastic materials. A buffer layer 201 may be formed on the substrate 200. The buffer layer 201 may provide a flat surface on the substrate 200 and may block foreign substance or moisture from permeating through the substrate 200.

The thin film transistor TFT may include an active layer A, a gate electrode G, a source electrode S, and a drain electrode D. Hereinafter, it is assumed that the thin film transistor TFT is a top gate type in which the active layer A, the gate electrode G, the source electrode S, and the drain electrode D are sequentially formed. However, the present embodiment is not limited thereto, and a thin film transistor TFT of various types, e.g., a bottom gate type, may be applied.

The active layer A may include a semiconductor material such as amorphous silicon or polycrystalline silicon. The active layer A may include, e.g., an organic semiconductor material or an oxide semiconductor material. A gate insulating layer 210 may be formed on the active layer A. The gate electrode G may be formed on the gate insulating layer 210. The gate electrode G may be connected to a gate line for applying an on/off signal to the thin film transistor TFT.

An interlayer insulating layer 230 may be formed on the gate electrode G, and the source electrode S and the drain electrode D may be formed on the interlayer insulating layer 230. The source electrode S and the drain electrode D may be connected to the active layer A by respective vias extending along the third direction Z through the interlayer insulating layer 230.

The first electrode 281 connected to the thin film transistor TFT may be formed on the planarization layer 250, and a second electrode 283 may be formed on the bank layer 270. The first electrode 281 and the second electrode 283 may be spaced apart from each other.

As illustrated in FIG. 2B, the opening portion 10a may be a portion through which at least a portion of the first electrode 281 is partially exposed. At least one opening portion 10a may be a portion where an LED chip 300 is seated such that the LED chip 300 is electrically connected to the TFT to thereby emit light. As an embodiment, when three LED chips 300 are seated on respective opening portions 10a, the light generated may include three colors.

That is, when three LED chip 300 are seated on respective opening portions 10a, a first color, a second color, or a third color may be generated in each opening portion 10a. As an embodiment, each of the first color, the second color, and the third color may be one of red, green, and blue.

As illustrated in FIG. 2A, any number of opening portions 10a may be formed and may be arranged side by side in a row direction and a column direction, e.g., in a matrix. As an embodiment, one or more opening portions 10a may be disposed to be spaced apart from each other by a predetermined distance, and may be arranged at regular intervals.

Hereinafter, the LED chip 300 seated on the opening portion 10a will be described with reference to FIG. 2B. The LED chip 300 may include a first semiconductor layer 302, a second semiconductor layer 304, an active layer 303 between the first semiconductor layer 302 and the second semiconductor layer 304, a first electrode pad 306, and a second electrode pad 307. The first semiconductor layer 302, the active layer 303, and the second semiconductor layer 304 may be stacked along the third direction Z.

The first semiconductor layer 302, the active layer 303, and the second semiconductor layer 304 may be formed by using one or more methods such as Metal Organic Chemical Vapor Deposition (MOCVD), Chemical Vapor Deposition (CVD), Plasma-Enhanced Chemical Vapor Deposition (PECVD), Molecular Beam Epitaxy (MBE), or Hydride Vapor Phase Epitaxy (HVPE).

The first semiconductor layer 302 may include, for example, a p-type semiconductor layer. The p-type semiconductor layer may include a semiconductor material having a composition formula of $In_xAl_yGa_{1-x-y}N$ ($0 \leq x \leq 1$, $0 \leq y \leq 1$, $0 \leq x+y \leq 1$). For example, the p-type semiconductor layer may include a semiconductor material selected from gallium nitride (GaN), aluminum nitride (AlN), aluminum gallium nitride (AlGaN), indium gallium nitride (InGaN), indium nitride (InN), indium gallium nitride (InAlGaN), and aluminum indium nitride (AlInN), and may be doped with a p-type dopant such, e.g., magnesium (Mg), zinc (Zn), calcium (Ca), strontium (Sr), or barium (Ba).

The second semiconductor layer 304 may include, for example, an n-type semiconductor layer. The n-type semiconductor layer may include a semiconductor material having a composition formula of $In_xAl_yGa_{1-x-y}N$ ($0 \leq x \leq 1$, $0 \leq y \leq 1$, $0 \leq x+y \leq 1$). For example, the n-type semiconductor layer may include a semiconductor material selected from GaN, AlN, AlGaN, InGaN, InN, InAlGaN, and AlInN, and may be doped with an n-type dopant, e.g., silicon (Si), germanium (Ge), or tin (Sn).

However, embodiments are not limited thereto, and the first semiconductor layer 301 may include an n-type semiconductor layer and the second semiconductor layer 304 may include a p-type semiconductor layer.

The active layer 303 may be a region where electrons and holes are recombined together, and it may transition to a lower energy level according to the recombination of electrons and holes to generate light of a corresponding wavelength. The active layer 303 may include a semiconductor material having a composition formula of $In_xAl_yGa_{1-x-y}N$ ($0 \leq x \leq 1$, $0 \leq y \leq 1$, $0 \leq x+y \leq 1$), and may be formed to have a single quantum well structure or a multi quantum well (MQW) structure. Also, the active layer 303 may include a quantum wire structure or a quantum dot structure.

The first electrode pad 306 may be formed at the first semiconductor layer 302, and the second electrode pad 307 may be formed at the second semiconductor layer 304. The LED chip 300 of the present embodiment may be a horizontal type or a flip type in which the first electrode pad 306 and the second electrode pad 307 are disposed in the same direction. In particular, as shown in FIG. 2B, the second semiconductor layer 304 may extend further along the X direction than the first semiconductor layer, e.g., on both sides thereof. Thus, the first electrode pad 306 and the second electrode pad 307 may be separated from each other, e.g., along the third direction Z and the first direction X.

In a method of manufacturing a display apparatus according to an embodiment, the guide plate 100 illustrated in FIG. 1 and the array substrate 10 illustrated in FIG. 2A may be prepared and then the array substrate 10 may be attached to the second surface 100-2 of the guide plate 100 as illustrated in FIG. 3. Since the guide plate 100 and the array substrate 10 are joined together, the first tunnel T1 may form a hole or passage, all sides of which are surrounded by the array substrate 10 and the second surface 100-2 of the guide plate 100.

Next, referring to FIGS. 3A and 3B, at least one LED chip 300 may be inserted into the first tunnel T1. Although the LED chip 300 is schematically illustrated in FIG. 3B, this is merely an example; and although it is illustrated differently from the shape of the LED chip 300 illustrated in FIG. 2B, the LED chip 300 of the same structure and function are schematically illustrated. Also, the shape of the LED chip 300 is not limited thereto and may vary according to various embodiments.

As an embodiment, the LED chip 300 may be inserted into the first tunnel T1 in the first direction X. The LED chip 300 inserted into the first tunnel T1 may move in the first tunnel T1. In this case, the LED chip 300 may move by a moving medium.

In an embodiment, the LED chip 300 may move by a solution. Hereinafter, an embodiment in which the LED chip 300 moves by a solution 301 to be seated on the opening portion 10a will be described with reference to FIGS. 2B and 3B.

First, the LED chip 300 and the array substrate 10 and the guide plate 100 joined together may be immersed into the solution 301. In this case, the LED chip 300 may move in the tunnel T1 according to the flow of the solution 301. When the LED chip 300 is inserted into the first tunnel T1 in the first direction X, the solution 301 and the LED chip 300 may flow and move in the first direction X.

As illustrated in FIG. 2B, when the array substrate 10 is immersed in the solution 301, a first voltage V1 may be applied to the first electrode 281 and a second voltage V2 may be applied to the second electrode 283. Each of the first voltage V1 and the second voltage V2 may be applied as a negative DC voltage.

Since a negative DC voltage is applied to the first electrode 281 and the second electrode 283, the free electrons of the LED chip 300 immersed in the solution may move away from the first electrode 281 and the second electrode 283 and a relatively positive potential may be induced by an electrostatic induction phenomenon in a region of the LED chip 300 that is close to the first electrode 281 and the second electrode 283 to which a negative voltage is applied. That is, a relatively positive potential may be induced in the first electrode pad 306 and the second electrode pad 307.

An attractive force may be generated by an electrostatic force between the first electrode pad 306 and the second electrode pad 307 of the LED chip 300 and the first electrode 281 and the second electrode 283 of the array substrate 10, and the LED chip 300 may move toward the array substrate 10. Since the first electrode pad 306 and the second electrode pad 307 of the LED chip 300 and the first electrode 281 and the second electrode 283 of the array substrate 10 are matched together, the first electrode pad 306 of the LED chip 300 may be connected to the first electrode 281 of the array substrate 10 and the second electrode pad 307 of the LED chip 300 may be connected to the second electrode 283 of the array substrate 10. Consequently, the LED chip 300 may be accurately seated on the opening portion 10a of the array substrate 10 to be connected to the first electrode 281 and the second electrode 283.

Thus, the method of manufacturing a display apparatus by using the LED chip mounting apparatus according to the present embodiment may increase the LED chip mounting accuracy to improve the display apparatus manufacturing efficiency and the reliability of the manufactured display apparatus. That is, the LED chip 300 may be seated at an accurate position on the opening portion 10a without the risk of moving through the first tunnel T1 in an unintended direction, e.g., the second direction Y perpendicular to the first direction X, while moving in the first direction X after being inserted into the first tunnel T1.

When the moving medium for the LED chip 300 is the solution 301, an electrostatic induction phenomenon may occur as described above. In this case, the solution 301 may further include a conductive particle in order to reduce or prevent generation of static electricity in the solution 301. That is, as an embodiment, the conductive particle, together with the LED chip 300 and the array substrate 10 and the guide plate 100 joined together, may be immersed into the solution 301. Thus, the conductive particle may move in the first tunnel T1 together with the LED chip 300, and the static electricity may be reduced or prevented.

Although FIGS. 2B and 3B illustrate an embodiment in which the LED chip 300 moves by the solution 301, the moving medium for the LED chip 300 is not limited thereto. For example, the LED chip 300 may move in the first tunnel T1 by air or inert gas. That is, in an environment where the array substrate 10 is exposed to the air or inert gas, the LED chip 300 may move in the first direction X (see FIG. 3A) by using the air or inert gas as the moving medium.

When the air or inert gas is used as the moving medium to move the LED chip 300, since the friction applied to the LED chip 300 may be reduced, the risk of damaging the LED chip 300 may be reduced. The inert gas may include any one of argon (Ar), nitrogen ($N_2$), and helium (He).

Even when the LED chip 300 moves by the air or inert gas, static electricity may be generated in the air or inert gas by the friction of the air. Thus, a conductive particle may be inserted into the air or inert gas together with the LED chip 300, and the conductive particle may move in the first tunnel T1 together with the LED chip 300, thereby reducing or preventing generation of static electricity.

Figure 4:
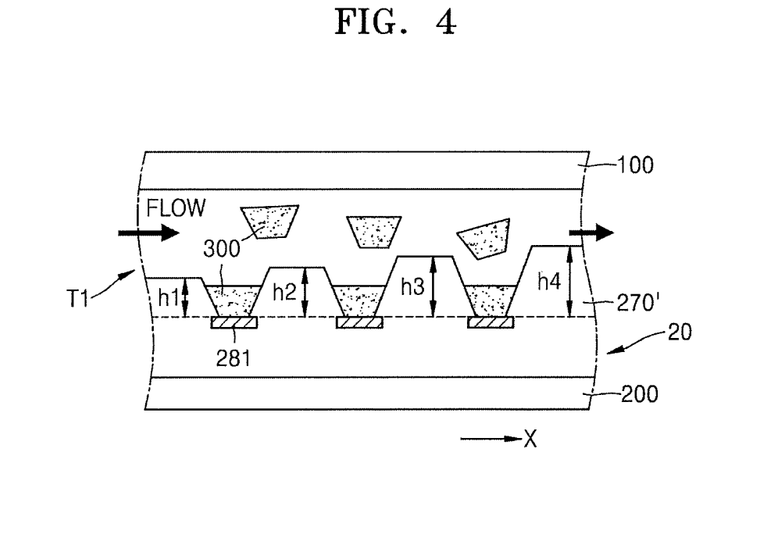
FIG. 4 illustrates a schematic cross-sectional view of a method of manufacturing a display apparatus according to another embodiment.

FIG. 4 is a cross-sectional view schematically illustrating a method of manufacturing a display apparatus according to another embodiment. In FIG. 4, like reference numerals as in FIGS. 1 to 3 will denote like elements, and redundant descriptions thereof will be omitted herein for conciseness.

In the method of manufacturing a display apparatus according to the present embodiment, first, the guide plate 100 according to the embodiment illustrated in FIG. 1 and an array substrate 20 according to another embodiment may be prepared. The array substrate 20 may include a first electrode 281 exposed partially by the opening portion 10a and a bank layer 270' disposed to cover a portion of the first electrode 281.

In the method of manufacturing a display apparatus according to the present embodiment, as illustrated in FIG. 4, two or more bank layers 270' may be included and the bank layers 270' may be formed to have different heights, e.g., along the third direction Z. As an embodiment, some bank layers 270' may be formed to have the same height, and the other bank layers 270' may be formed to have different heights. For example, heights of the bank layers 270' may increase gradually away from the side or location where the LED chip 300 is inserted. That is, as illustrated in FIG. 4, a height h1 of the bank layer 270' located closest to the side where the LED chip 300 is inserted is shorter than that of increasingly taller bank layers 270' located away from the side where the LED chip 300 is inserted having heights h2, h3, and h4, respectively, such that h1<h2<h3<h4 may be satisfied.

Next, as in the embodiment illustrated in FIG. 3B, the guide plate 100 and the array substrate 20 illustrated in FIG.

4 may be joined together. Thereafter, the LED chip 300 may be inserted into the first tunnel T1 so that the LED chip 300 may move in the first direction X.

In this case, according to the method of manufacturing a display apparatus according to the present embodiment, by using the array substrate 20 in which the heights of the bank layers 270' increase gradually away from the side where the LED chip 300 is inserted, the probability of the LED chip 300 being seated also on the opening portion 10a located distant from the side where the LED chip 300 is inserted may be increased.

That is, since the heights of the bank layers 270' increase gradually away from the side where the LED chip 300 is inserted, the probability of the moving LED chip 300 being bumped against the bank layer 270' may be increased. Consequently, since the moving speed of the LED chip 300 bumped against the bank layer 270' is reduced, the probability of it being seated on the opening portion 10a may be increased.

Figure 5:
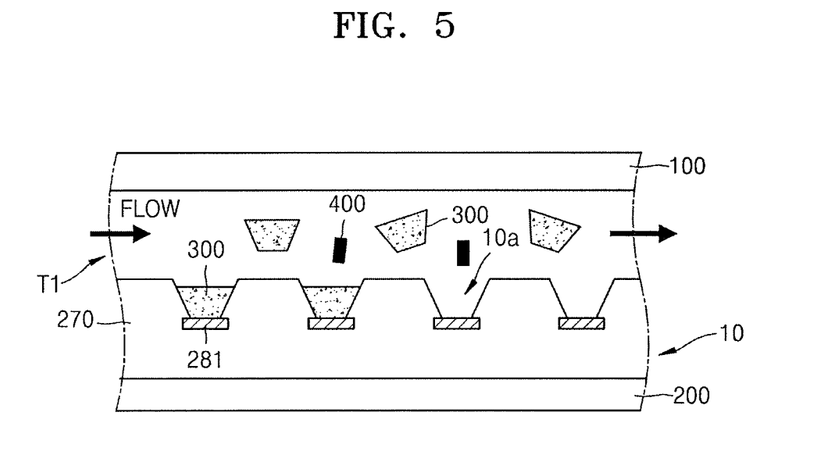
FIG. 5 illustrates a schematic cross-sectional view of a method of manufacturing a display apparatus according to another embodiment.

FIG. 5 is a cross-sectional view schematically illustrating a method of manufacturing a display apparatus according to another embodiment. In FIG. 5, like reference numerals as in FIGS. 1 to 3 will denote like elements, and redundant descriptions thereof will be omitted herein for conciseness.

In the method of manufacturing a display apparatus according to the present embodiment, the LED chip 300 may be inserted into the first tunnel T1, so that the LED chip 300 may be seated on the opening portion 10a while moving in the first direction X. The LED chip 300 may flow and move in the first tunnel T1 by various moving mediums, e.g., a solution, air, or inert gas as described above.

In the method of manufacturing a display apparatus according to the present embodiment, a flexible particle 400 may be inserted into the moving medium together with the LED chip 300. The flexible particle 400 is not limited to a particular material and may be any particle including a soft and flexible material.

Although FIG. 5 illustrates the flexible particle 400 existing in the first tunnel T1, this is merely an embodiment and the number and shape of flexible particles 400 are not limited thereto. As an embodiment, the LED chip 300 and the flexible particle 400 may be inserted together into the solution, and the resulting structure may be inserted into the first tunnel T1. As another embodiment, the LED chip 300 and the flexible particle 400 may be inserted together into the air or inert gas, and the resulting structure may be inserted into the first tunnel T1.

When two or more LED chips 300 are inserted into the first tunnel T1, the LED chips 300 may collide with each other while moving and thus the LED chip 300 may be damaged. Thus, according to the method of manufacturing a display apparatus according to the present embodiment, since the flexible particle 400 is inserted together with the LED chip 300, the probability of the LED chips 300 being bumped against each other may be reduced and the LED chip 300 may bump against the flexible particle 400 without damage.

As an embodiment, the LED chips 300 and the flexible particles 400 may be alternately inserted thereinto. That is, when the flexible particle 400 is disposed between two LED chips 300 as illustrated in FIG. 4, since the LED chips 300 may not bump each other and the flexible particle 400 may perform a shock-absorbing function. Thus, the LED chip 300 may be prevented from being damaged and a higher-reliability display apparatus may be manufactured.

Figure 6:
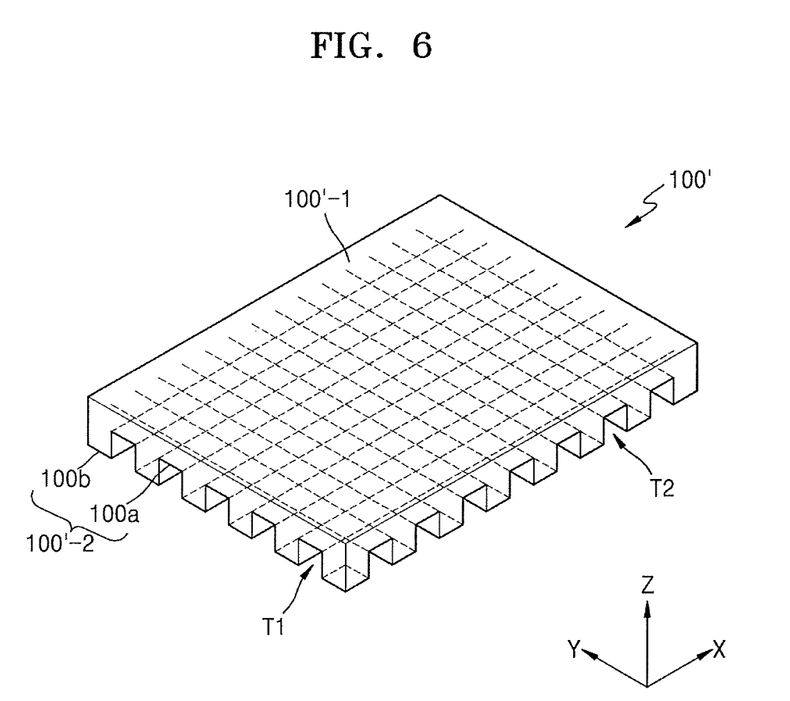
FIG. 6 illustrates a schematic perspective view of an LED chip mounting apparatus according to another embodiment.

FIG. 6 is a perspective view schematically illustrating an LED chip mounting apparatus according to another embodiment. In FIG. 6, like reference numerals as in FIG. 1 will denote like elements, and redundant descriptions thereof will be omitted herein for conciseness.

An LED chip mounting apparatus according to the present embodiment may include a guide plate 100' including at least one first tunnel T1 and at least one second tunnel T2. The guide plate 100' may include a first surface 100'-1 and a second surface 100'-2 opposite to the first surface 100'-1. The first tunnel T1 and the second tunnel T2 may be disposed at the second surface 100'-2 of the guide plate 100'. The first tunnel T1 may be disposed to extend in the first direction X and the second tunnel T2 may be disposed to extend in the second direction Y perpendicular to the first direction X.

Although FIG. 6 illustrates an embodiment in which five first tunnels T1 and seven second tunnels T2 are disposed at the second surface 100'-2, the number of first tunnels T1 and the number of second tunnels T2 are not limited thereto. For example, one or more first tunnels T1 and one or more second tunnels T2 may be disposed at the second surface 100'-2.

In the LED chip mounting apparatus according to the present embodiment, as illustrated in FIG. 6, the first tunnel T1 and the second tunnel T2 may be formed to pass through two pairs of two surfaces that are perpendicular to the first surface 100'-1 and the second surface 100'-2 and face each other, e.g., side surfaces of the guide plate 100' that face each other. In this case, the second surface 100'-2 of the guide plate 100' may include a concave portion 100a and a convex portion 100b.

That is, since the first tunnel T1 and the second tunnel T2 are disposed at the second surface 100'-2 to pass through the side surfaces of the guide plate 100', the concave portion 100a of the second surface 100'-2 may correspond to a portion where the first tunnel T1 and the second tunnel T2 are formed, and the convex portion 100b may correspond to a portion adjacent to the concave portion 100a and where the first tunnel T1 and the second tunnel T2 are not formed.

As an embodiment, when two or more first tunnels T1 and two or more second tunnels T2 are disposed at the second surface 100'-2, the concave portion 100a may correspond to a portion where the first tunnel T1 and the second tunnel T2 are formed and the convex portion 100b may correspond to a portion between two first tunnels T1 and a portion between two second tunnels T2. In the LED chip mounting apparatus according to the present embodiment, since at least one first tunnel T1 and at least one second tunnel T2 are formed at the second surface 100'-2 of the guide plate 100', the second surface 100'-2 may be include a mesh structure.

In the method of manufacturing a display apparatus by using the LED chip mounting apparatus according to the present embodiment, at least one LED chip 300 may be inserted into the first tunnel T1 in the first direction X or may be inserted into the second tunnel T2 in the second direction Y. As an embodiment, when two or more LED chips 300 are inserted, they may be inserted into the first tunnel T1 or into the second tunnel T2. The method of manufacturing a display apparatus by using the LED chip mounting apparatus according to the present embodiment may increase the LED chip mounting accuracy to improve the display apparatus manufacturing efficiency.

Figure 7A:
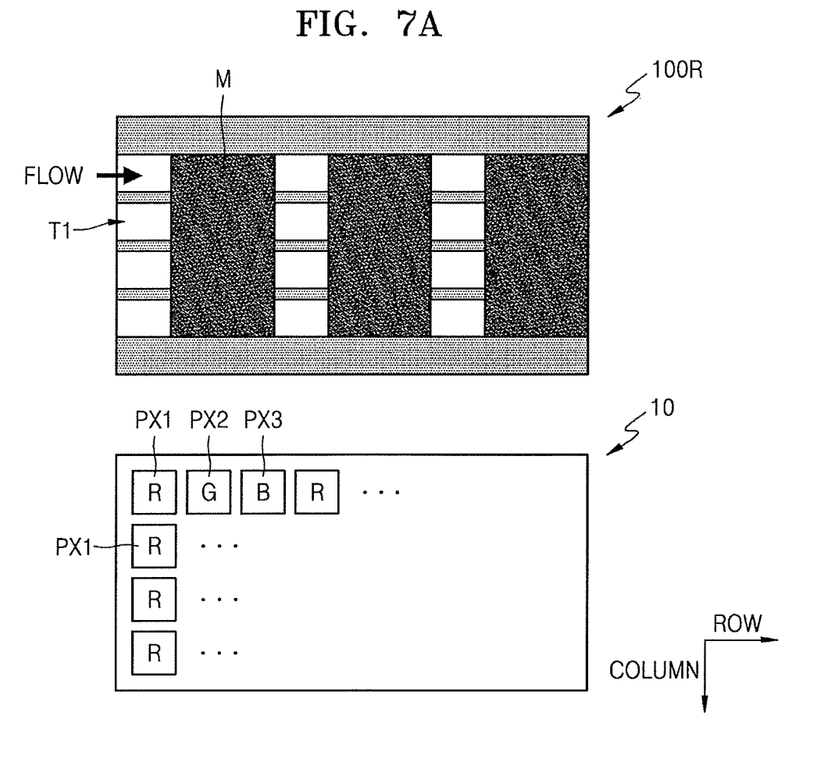
FIG. 7A illustrates a schematic bottom view of an LED chip mounting apparatus according to another embodiment and a schematic plan view of an array substrate according to another embodiment.
Figure 7B:
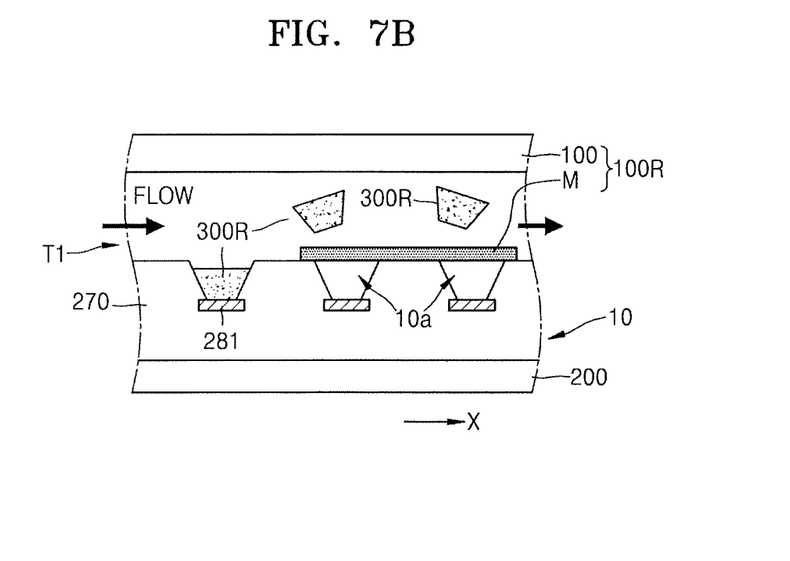
FIG. 7B illustrates a cross-sectional view of a method of manufacturing a display apparatus using the array substrate and the LED chip mounting apparatus of FIG. 7A.

FIG. 7A illustrates a schematic bottom view of an LED chip mounting apparatus according to another embodiment and a schematic plan view of an array substrate according to another embodiment. FIG. 7B is a cross-sectional view schematically illustrating a method of manufacturing a display apparatus by using the array substrate and the LED chip mounting apparatus of FIG. 7A. In FIGS. 7A and 7B, like reference numerals as in FIGS. 1 to 5 will denote like elements, and redundant descriptions thereof will be omitted herein for conciseness.

An LED chip mounting apparatus 100R according to the present embodiment may include a guide plate 100 (see FIG. 1) and a mask M. Hereinafter, the LED chip mounting apparatus 100R according to the present embodiment will be described with reference to FIGS. 1 and 7A.

The LED chip mounting apparatus 100R according to the present embodiment may include the guide plate 100 including at least one first tunnel T1 (see FIG. 1) as in the embodiment illustrated in FIG. 1 and the mask M located at the second surface 100-2 of the guide plate 100. The mask M may be disposed in at least a partial region of the second surface 100-2 of the guide plate 100.

FIG. 7A is a bottom view of the LED chip mounting apparatus according to another embodiment. Thus, referring to FIGS. 1 and 7A, the mask M may contact at least a portion of the concave portion 100b of the second surface 100-2 to overlap at least one convex portion 100a.

Since the array substrate 10 is attached to the second surface 100-2 of the guide plate 100 as described above, the mask M may be disposed between the array substrate 10 and the second surface 100-2 of the guide plate 100. In the LED chip mounting apparatus 100R according to the present embodiment, since the mask M is disposed at the second surface 100-2 corresponding to, e.g., overlapping or covering, portions except the target mounting position for the LED chip 300, the mounting accuracy of the LED chip 300 may be improved.

As illustrated in FIG. 7B, a plurality of first pixel units PX1, second pixel units PX2, and third pixel units PX3 may be arranged on the array substrate 10. Although not illustrated, as in the case of FIG. 2A, an opening portion 10a may be formed to correspond to each of the first pixel unit PX1, the second pixel unit PX2, and the third pixel unit PX3.

As an embodiment, the first pixel unit PX1, the second pixel unit PX2, and the third pixel unit PX3 may be respectively pixel units emitting a first color, a second color, and a third color; and the first color, the second color, and the third color may be respectively red (R), green (G), and blue (B). However, embodiments are not limited thereto, and the first pixel unit PX1, the second pixel unit PX2, and the third pixel unit PX3 may emit other colors of lights. Hereinafter, for convenience of description, it is assumed that the first color, the second color, and the third color are respectively red (R), green (G), and blue (B).

In the array substrate 10 according to the present embodiment, the first pixel unit PX1, the second pixel unit PX2, and the third pixel unit PX3 may be arranged sequentially in the row direction as illustrated in FIG. 7A. Also, the pixel units emitting the same color may be arranged in the column direction. That is, as an embodiment, a plurality of first pixel units PX1 emitting red (R) may be arranged in the first column, and a plurality of second pixel units PX2 emitting green (G) may be arranged in the second column.

As described above, since the mask M may be disposed in at least a partial region of the second surface 100-2, it may be disposed at a position corresponding to at least a portion among the first pixel unit PX1, the second pixel unit PX2, and the third pixel unit PX3 on the array substrate 10. In the method of manufacturing a display apparatus by using the LED chip mounting apparatus 100R according to the present embodiment, at least one first color LED chip 300R may be inserted into the first tunnel T1 as illustrated in FIG. 7B. The first color LED chip 300R may be an LED chip emitting the first color R. That is, the first color (R) LED chip 300R may be a red LED chip.

In the LED chip mounting apparatus 100R according to the present embodiment, the mask M may be disposed at a position corresponding to a plurality of second pixel units PX2 and third pixel units PX3 as illustrated in FIGS. 7A and 7B. That is, in a plurality of second pixel units PX2 and third pixel units PX3 located at the array substrate 10, opening portions 10a corresponding to the second pixel units PX2 and the third pixel units PX3 may be blocked by the mask M.

Thus, when at least one first color LED chip 300R is inserted into the first tunnel T1, since the mask M blocks the opening portion 10a of the second pixel units PX2 and the third pixel units PX3, the first color LED chip 300R may be seated on opening portions 10a corresponding to the first pixel units PX1. That is, since the first color LED chip 300R is not seated in the other pixel units, but may be seated only on opening portions 10a corresponding to the first pixel units PX1 emitting the first color R, the LED chip mounting accuracy may be improved.

The LED chip mounting apparatus 100R according to the present embodiment is for accurately mounting the first color LED chip 300R, and an LED chip mounting apparatus 100G or 100B (not illustrated) for mounting a second color LED chip 300G (not illustrated) or a third color LED chip 300B (not illustrated) may be formed like the LED chip mounting apparatus 100R according to the present embodiment. That is, although not illustrated, the LED chip mounting apparatus 100G for accurately mounting the second color LED chip 300G (not illustrated) may include the mask M disposed at the position corresponding to the first pixel units PX1 and the third pixel units PX3. Also, the LED chip mounting apparatus 100B for accurately mounting the third color LED chip 300B may include the mask M disposed at the position corresponding to the first pixel units PX1 and the second pixel units PX2.

Figure 8:
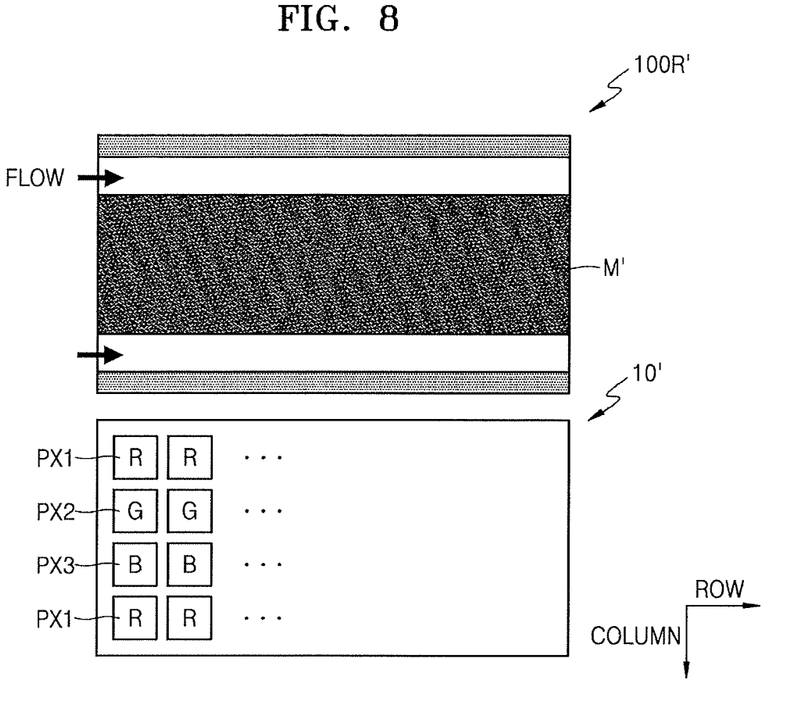
FIG. 8 illustrates a schematic bottom view of an LED chip mounting apparatus according to another embodiment and a schematic plan view of an array substrate according to another embodiment.

FIG. 8 illustrates a schematic bottom view of an LED chip mounting apparatus according to another embodiment and a schematic plan view of an array substrate according to another embodiment. In FIG. 8, like reference numerals as in FIG. 7A will denote like elements, and redundant descriptions thereof will be omitted herein for conciseness.

A plurality of first pixel units PX1, second pixel units PX2, and third pixel units PX3 may be arranged on the array substrate 10 according to the present embodiment. In the array substrate 10 according to the present embodiment, the first pixel unit PX1, the second pixel unit PX2, and the third pixel unit PX3 may be arranged sequentially in the column direction. Also, the pixel units emitting the same color may be arranged in the row direction. That is, as an embodiment, a plurality of first pixel units PX1 emitting red (R) may be arranged in the first row, a plurality of second pixel units PX2 emitting green (G) may be arranged in the second row, and a plurality of third pixel units PX3 emitting blue (B) may be arranged in the third row.

An LED chip mounting apparatus 100R' according to the present embodiment is for mounting the first color LED chip 300R (see FIG. 7B), and may include a mask M' disposed at a position corresponding to the second pixel units PX2 and the third pixel units PX3. Since the mask M blocks the opening portion 10a of the second pixel units PX2 and the third pixel units PX3, the first color LED chip 300R may be seated on the opening portion 10a of the first pixel units PX1. That is, since the first color LED chip 300R is blocked from being seated in opening portions corresponding to the other pixel units, e.g., may be seated only on opening portions 10a corresponding to the first pixel units PX1 emitting the first color R, the LED chip mounting accuracy may be improved.

By way of summation and review, while inorganic LEDs are cheaper, brighter, and longer in life than the organic LEDs, but, unlike organic LEDS, inorganic LEDs may not be formed directly on a flexible substrate by using a thin film process. Therefore, mass production thereof is complicated.

One or more embodiments include methods of manufacturing full-color display apparatuses by transferring inorganic LEDs to flexible substrates. According to the one or more embodiments, the accuracy in the LED chip mounting process may be improved. Also, the damage to the LED chip in the LED chip mounting process may be minimized. One or more embodiments provide an LED chip mounting apparatus to facilitate mounting of LED chips.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a display apparatus, the method comprising:
preparing a guide plate including a first surface and a second surface opposite to the first surface, the second surface having at least one first tunnel extending in a first direction;
attaching an array substrate including at least one thin film transistor and at least one opening portion to the second surface of the guide plate;
inserting at least one light emitting diode (LED) chip into the first tunnel in the first direction;
moving the at least one LED chip in the first tunnel; and
seating the at least one LED chip on the at least opening portion in the first tunnel.

2. The method as claimed in claim 1, further comprising immersing the guide plate, the array substrate, and the at least one LED chip into a solution after attaching the guide plate and the array substrate together,
wherein the at least one LED chip moves in the first tunnel by the solution.

3. The method as claimed in claim 2, wherein the solution includes a conductive particle.

4. The method as claimed in claim 2, wherein
the solution comprises at least one flexible particle, and
the at least one LED chip and the at least one flexible particle are alternately inserted into the first tunnel.

5. The method as claimed in claim 1, wherein the at least one LED chip moves in the first tunnel by air or inert gas.

6. The method as claimed in claim 5, wherein the inert gas includes one of argon (Ar), nitrogen ($N_2$), and helium (He).

7. The method as claimed in claim 5, wherein the air or the inert gas includes a conductive particle.

8. The method as claimed in claim 5, wherein
the air or the inert gas includes at least one flexible particle, and
the at least one LED chip and the at least one flexible particle are alternately inserted into the first tunnel.

9. The method as claimed in claim 1, wherein
the array substrate further includes a first electrode exposed by the at least one opening portion and two or more bank layers disposed to cover a portion of the first electrode, and
the two or more bank layers have different heights.

10. The method as claimed in claim 9, wherein the height of the bank layer increases gradually away from a location where the LED chip is inserted.

11. The method as claimed in claim 1, wherein at least one second tunnel that extends in a second direction perpendicular to the first direction is on the second surface of the guide plate.

12. The method as claimed in claim 11, wherein the at least one LED chip is inserted into the at least one first tunnel in the first direction or is inserted into the at least one second tunnel in the second direction.

13. The method as claimed in claim 1, wherein a plurality of first color pixel units, second color pixel units, and third color pixel units are to be arranged on the array substrate, the method further including
providing a mask between the array substrate and the second surface of the guide plate at a position corresponding to at least a portion among the plurality of first color pixel units, second color pixel units, and third color pixel units.

14. The method as claimed in claim 13, wherein the at least one LED chip is seated on the opening portion formed at the first color pixel unit, the second color pixel unit, or the third color pixel unit where the mask is not disposed.

15. The method as claimed in claim 13, wherein, when the at least one LED chip inserted into the first tunnel is a first color LED chip, the method includes:
providing the mask at a position corresponding to the second color pixel unit and the third color pixel unit, and
seating the first color LED chip on the opening portion of the first color pixel unit.

16. The method as claimed in claim 13, wherein the first color pixel unit, the second color pixel unit, and the third color pixel unit are arranged sequentially in a row direction.

17. The method as claimed in claim 13, wherein the first color pixel unit, the second color pixel unit, and the third color pixel unit are to be arranged sequentially in a column direction.

* * * * *